United States Patent
Chen et al.

(10) Patent No.: US 10,321,599 B2
(45) Date of Patent: Jun. 11, 2019

(54) ROTATABLE MOUNTING BRACKET ON CHASSIS

(71) Applicant: QUANTA COMPUTER INC., Taoyuan (TW)

(72) Inventors: Chao-Jung Chen, Taoyuan (TW); Chih-Ming Chen, Taoyuan (TW)

(73) Assignee: Quanta Computer Inc., Taoyuan (TW)

( * ) Notice: Subject to any disclaimer, the term of this patent is extended or adjusted under 35 U.S.C. 154(b) by 0 days.

(21) Appl. No.: 15/409,304

(22) Filed: Jan. 18, 2017

(65) Prior Publication Data

US 2018/0098454 A1    Apr. 5, 2018

Related U.S. Application Data

(60) Provisional application No. 62/402,333, filed on Sep. 30, 2016.

(51) Int. Cl.
*A47B 96/07*    (2006.01)
*H05K 7/14*    (2006.01)
*A47B 96/06*    (2006.01)

(52) U.S. Cl.
CPC ......... *H05K 7/1489* (2013.01); *A47B 96/066* (2013.01); *A47B 96/07* (2013.01)

(58) Field of Classification Search
CPC ...... H05K 7/1489; A47B 96/066; A47B 96/07
USPC ....................................................... 361/724
See application file for complete search history.

(56) References Cited

U.S. PATENT DOCUMENTS

| | | | |
|---|---|---|---|
| 6,398,041 B1 | 6/2002 | Abbott | |
| 7,193,856 B2* | 3/2007 | Hidaka | G11B 33/126 |
| | | | 211/190 |
| 9,769,947 B1* | 9/2017 | Sands | H05K 7/1491 |
| 2005/0284033 A1 | 12/2005 | Chen | |
| 2008/0135705 A1* | 6/2008 | Chuang | H05K 7/1489 |
| | | | 248/243 |
| 2008/0310083 A1 | 12/2008 | Walls | |
| 2011/0100935 A1* | 5/2011 | Yang | H05K 7/1489 |
| | | | 211/26 |
| 2012/0292274 A1 | 11/2012 | Lin et al. | |
| 2014/0111070 A1* | 4/2014 | Ehlen | H05K 7/1489 |
| | | | 312/223.2 |

FOREIGN PATENT DOCUMENTS

| | | |
|---|---|---|
| CN | 103533799 A | 1/2014 |
| EP | 2672795 A2 | 12/2013 |
| JP | 2011222638 A | 11/2011 |

(Continued)

OTHER PUBLICATIONS

Taiwanese Office Action for Application No. 106109809, dated Aug. 31, 2017, w/ First Office Action Summary.

(Continued)

*Primary Examiner* — Rockshana D Chowdhury
(74) *Attorney, Agent, or Firm* — Nixon Peabody LLP; Zhou Lu (57) ABSTRACT

A mounting bracket for mounting server/switch chassis to a rack is provided. The mounting bracket includes a mounting flange, a member portion connected to a server/switch chassis, a pivoting mechanism connecting the member portion and the mounting flange, where the mounting flange pivots along the pivoting mechanism to move from a first side of the rack to a second side of the rack.

13 Claims, 5 Drawing Sheets

(56) References Cited

FOREIGN PATENT DOCUMENTS

| | | |
|---|---|---|
| JP | 2015153858 A | 8/2015 |
| TW | 200601941 A | 1/2006 |
| TW | 201325395 A | 6/2013 |

OTHER PUBLICATIONS

Extended European Search Report for EP Application No. 17172069.1, dated Sep. 1, 2017, w/ Search Report Summary.

JP Office Action for Application No. 2017-130888 dated Jul. 24, 2018, w/ First Office Action Summary.

* cited by examiner

ROTATABLE MOUNTING BRACKET ON CHASSIS

FIELD OF THE INVENTION

This application claims priority to and the benefit of U.S. Non-Provisional Patent Application No. 62/402,333, filed Sep. 30, 2016 and entitled "ROTATABLE MOUNTING BRACKET ON CHASSIS DESIGN", the contents of which are hereby incorporated by reference in their entirety.

FIELD OF THE INVENTION

The present invention relates to a rotatable mounting bracket, and more specifically to a rotatable mounting bracket on server or switch chassis.

BACKGROUND

Switch/Server chassis, which are installed on racks, are conventionally installed and removed from the same side of the rack. That is, if a server/switch chassis is installed from the front of a rack, it can only be removed from the front of the rack.

Thus, the traditional bracket design of the server/switch chassis is limiting and does not allow the server/switch chassis to go through the rack.

Therefore, there is a need for a bracket that can allow server/switch chassis to be installed from one side of the rack and be removed from the other side, thereby allowing the server/switch chassis to be able to pass through the rack and improving convenience of service and reducing service time.

SUMMARY

Embodiments of the invention concern a rotatable mounting bracket on chassis

According to an aspect of an exemplary embodiment, a mounting bracket for mounting server/switch chassis to a rack includes a mounting flange, and a member portion connected to a server/switch chassis, a pivoting mechanism connecting the member portion and the mounting flange, wherein the mounting flange pivots along the pivoting mechanism to move from a first side of the rack to a second side of the rack.

According to another exemplary embodiment, the mounting flange is configured to pivot 360 degrees along the pivoting mechanism.

According to another exemplary embodiment, the mounting flange is configured to pivot 180 degrees along the pivoting mechanism.

According to another exemplary embodiment, the pivoting mechanism is a sliding mechanism and wherein the pivoting of the mounting flange along the pivoting mechanism comprises sliding the mounting flange along the sliding mechanism.

According to another exemplary embodiment, the mounting flange is configured to slide along the sliding mechanism to overlap the member portion.

According to another exemplary embodiment, the pivoting mechanism is a rotational mechanism and wherein the pivoting of the mounting flange along the pivoting mechanism comprises rotating along the rotational mechanism to overlap the member portion.

According to another exemplary embodiment, the mounting flange is configured to rotate 360 degrees along pivoting mechanism.

According to another exemplary embodiment, the mounting flange is configured to rotate 180 degrees along the pivoting mechanism.

According to another exemplary embodiment, the mounting bracket further includes a locking mechanism located on the mounting flange, and an unlocking plug located on the mounting flange, wherein the locking mechanism locks the mounting bracket to the rack when the mounting flange comes in contact with the rack, and the unlocking plug unlocks the mounting bracket from the panel when the unlock plug is pressed.

According to another aspect of an exemplary embodiment, a system for storing server/switch chassis includes a rack, at least one server/switch chassis, a rotatable mounting flange, wherein the rotatable mounting bracket comprises a member portion which is connected to the at least one server/switch chassis, and the rotatable mounting bracket comprises a mounting flange which further comprises a locking mechanism to lock the mounting bracket with the rack once the mounting bracket and the rack come in contact with each other.

According to another exemplary embodiment, the rotatable mounting bracket further comprises a pivoting mechanism connecting the member portion and the mounting flange, and wherein the mounting flange pivots along the pivoting mechanism to move from a first side of the rack to a second side of the rack.

According to another exemplary embodiment, the mounting flange is configured to pivot 360 degrees along the pivoting mechanism.

According to another exemplary embodiment, the mounting flange is configured to pivot 180 degrees along the pivoting mechanism.

According to another exemplary embodiment, the pivoting mechanism is a sliding mechanism and wherein the pivoting of the mounting flange along the pivoting mechanism comprises sliding the mounting flange along the sliding mechanism.

According to another exemplary embodiment, the mounting flange is configured to slide along the sliding mechanism to overlap the member portion.

According to another exemplary embodiment, the pivoting mechanism is a rotational mechanism and wherein the pivoting of the mounting flange along the pivoting mechanism comprises rotating along the rotational mechanism to overlap the member portion.

According to another exemplary embodiment, the mounting flange is configured to rotate 360 degrees along the pivoting mechanism.

According to another exemplary embodiment, the mounting flange is configured to rotate 180 degrees along the pivoting mechanism.

DETAILED DESCRIPTION

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As discussed above, there is significant interest in developing a bracket that can allow server/switch chassis to be installed from one side of the rack and be removed from the other side, thereby allowing the server/switch chassis to be able to pass through the rack and improving convenience of service and reducing service time.

In view of the foregoing, the present disclosure contemplates a rotatable mounting bracket. Design for such a bracket, with its different exemplary embodiments, is illustrated in FIGS. 1-6.

Figure 1A:
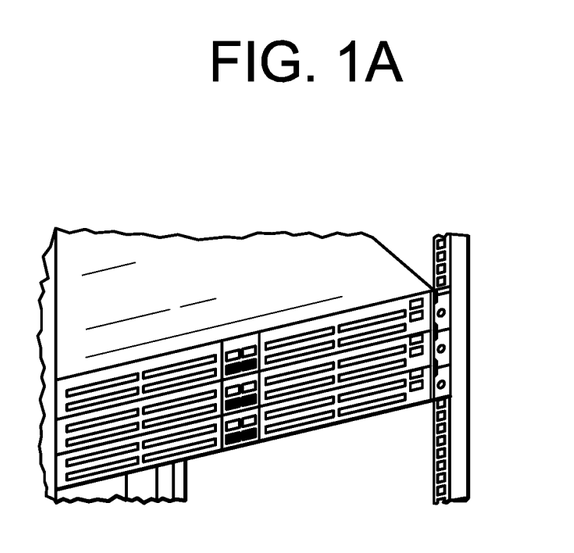
FIGS. 1A and 1B depicts the conventional mounting bracket used on switch/server chassis, according to an exemplary embodiment.
Figure 1B:
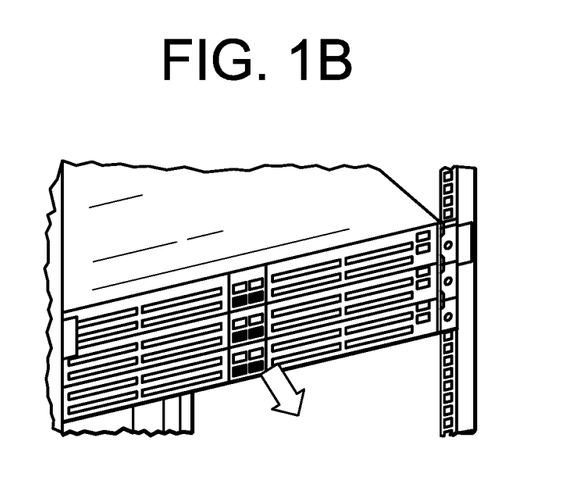

FIG. 1 depicts the conventional mounting bracket used on switch/server chassis, according to an exemplary embodiment.

As can be seen in FIG. 1A, conventional mounting brackets connected to the server/switch chassis is used to connect chassis with the rack. It is clear that the chassis can move in and out of the rack only from one side of the rack.

FIG. 1B further depicts an embodiment where the bracket sits flush with the rack and can be locked with the rack using a screw/washer. The figure clearly depicts the downside of the conventional mounting brackets, limiting the movement of the chassis to only one side of the rack.

FIGS. 2A-2D depict a rotatable mounting bracket on a server/switch chassis interacting with a rack, according to an exemplary embodiment.

Figure 2A:
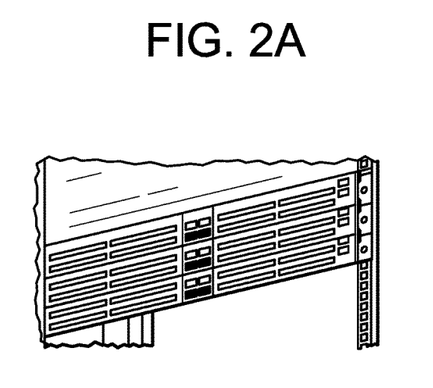
FIGS. 2A-2D depict a rotatable mounting bracket on a server/switch chassis interacting with a rack, according to an exemplary embodiment.

FIG. 2A depicts an exemplary embodiment of the rotatable mounting bracket, where the bracket sits flush with the rack, in turn locking the chassis in place with the rack.

Figure 2B:
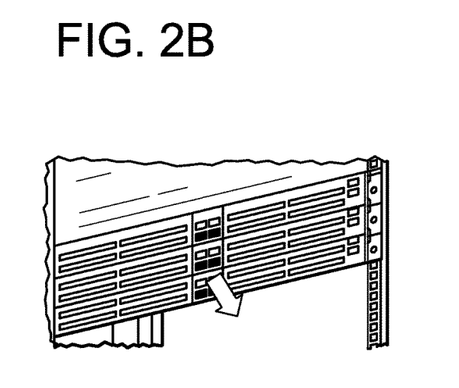

FIG. 2B depicts an exemplary embodiment where the rotatable mounting bracket is rotated to move towards the server/switch, thereby no longer obstructing the motion of the server/switch chassis in and out of the rack from either side of the rack.

Figure 2C:
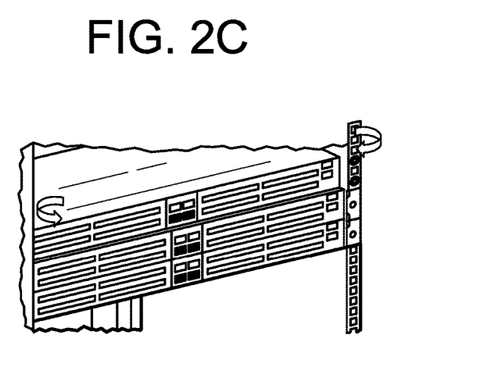

FIG. 2C depicts the rotatable mounting brackets completely rotated with the server/switch chassis in a condition to be moved out of the rack.

Figure 2D:
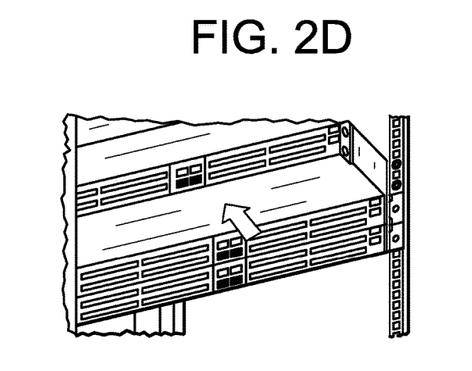

FIG. 2D depicts an exemplary embodiment of the server/switch chassis being moved out of the rack from the back side of the rack, with the rotatable mounting bracket not obstructing such motion by having been rotated and moved out of the way of the rack.

Different embodiments of the rotatable mounting bracket, with exemplary embodiments of rotation of the mounting bracket are described below with reference to FIGS. 3-5.

Figure 3A:
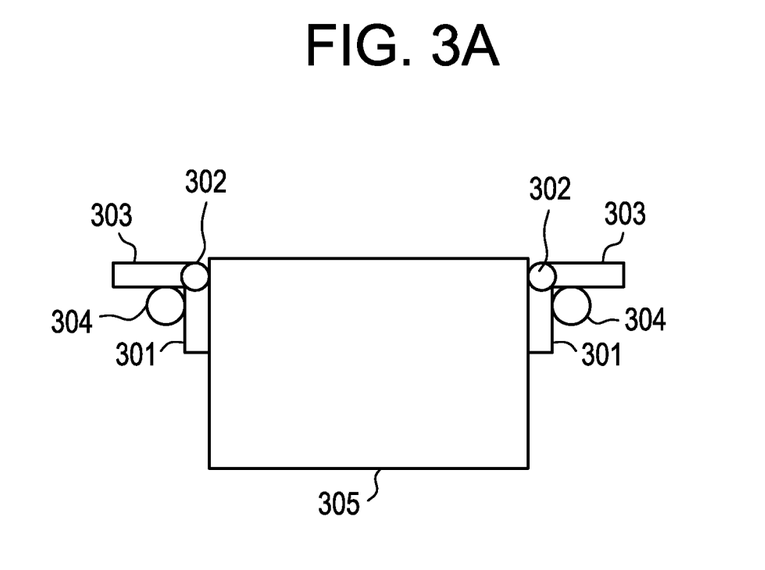
FIGS. 3A and 3B depict an exemplary embodiment of a rotatable mounting bracket providing a top view of the rack.
Figure 3B:
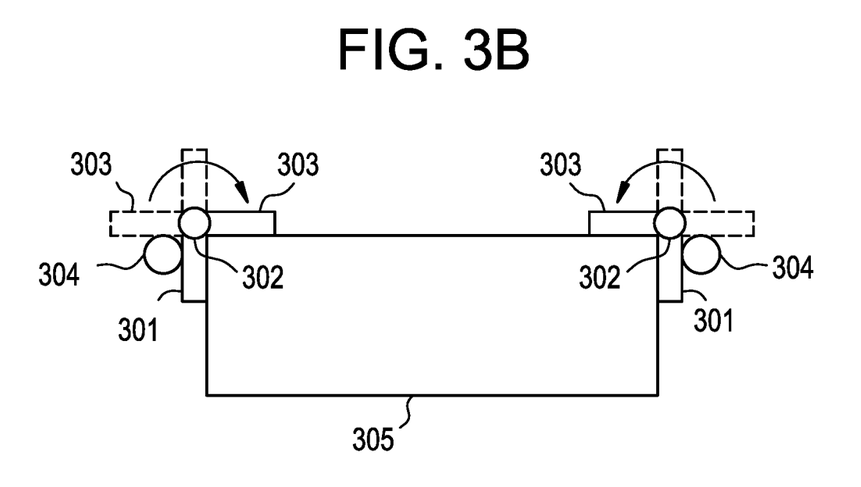

FIGS. 3A and 3B depict an exemplary embodiment of a rotatable mounting bracket, as seen from the top view of the rack.

As can be seen in FIG. 3A, the rotatable mounting bracket depicts a member portion 301, which connects with a portion of the server/switch chassis 305 via screws, bolts or other fasteners. The member portion 301 may have openings (not shown) which correspond to openings on server/switch chassis 305, which may be used to fasten the member portion 301 to the server/switch chassis 305.

The rotatable mounting bracket further incorporates a mounting flange 303 which connects to a mounting portion of the rack 304. As can be seen in FIG. 3A, the rack 304 is depicted from the top view as being connected to the mounting flange 303. The connection between the mounting flange 303 and the mounting portion of the rack 304 may be made via screws, bolts or other fasteners. The mounting flange 303 may have openings (not shown) which correspond to openings on the rack 304, which may be used to fasten the mounting flange 303 to the rack 304.

The pivoting mechanism 302 connects the member portion 301 and the mounting flange 303. According to an exemplary embodiment, when the server/switch is in need to be removed from the rack, the mounting flange 303 can be rotated along the pivoting mechanism 302 to move out of the way of the rack towards the server/switch chassis, as shown in FIG. 3B. Such a movement of the mounting flange 303, as is shown using the arrow and the dotted positioning, allows for free movement of the chassis in and out of the rack from either side of the rack 304, without any concern that the mounting flange 303 will interfere with the rack 304.

Figure 4A:
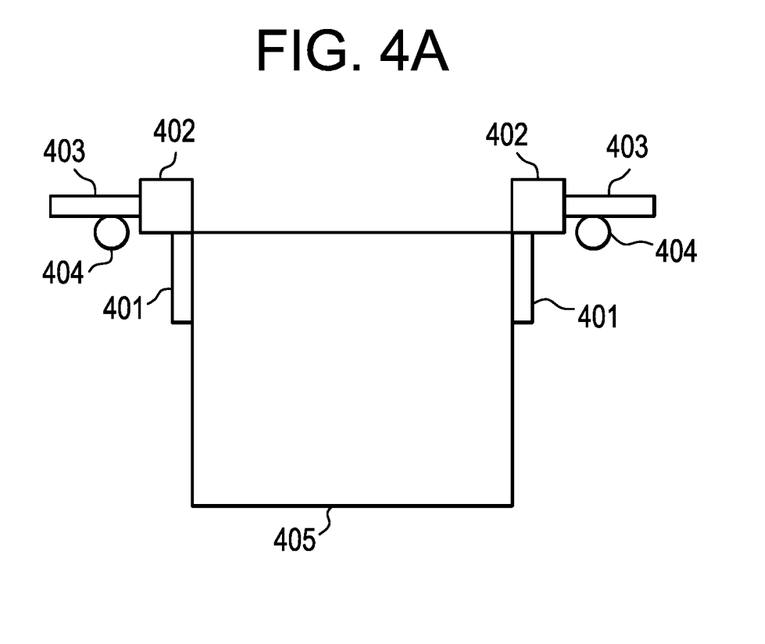
FIGS. 4A and 4B depict another exemplary embodiment of a rotatable mounting bracket.
Figure 4B:
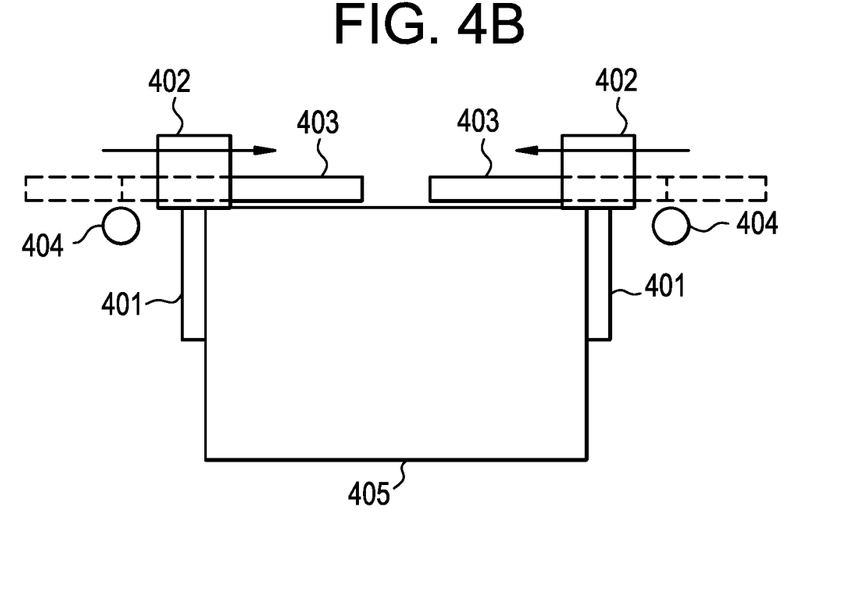

FIGS. 4A and 4B depict another exemplary embodiment of a rotatable mounting bracket, as shown from the top view of the rack.

As can be seen in FIGS. 4A and 4B, the rotatable mounting bracket depicts a member portion 401, which connects with a portion of the server/switch chassis 405 via screws, bolts or other fasteners. The member portion 401 may have openings (not shown) which correspond to openings on server/switch chassis 405, which may be used to fasten the member portion 401 to the server/switch chassis 405.

The rotatable mounting bracket further incorporates a mounting flange 403 which connects to a sliding mechanism 402. As can be seen in FIG. 4A, the rack 404 is depicted from the top view as being connected to the mounting flange 403. The connection between the mounting flange 403 and the mounting portion of the rack 404 may be made via screws, bolts or other fasteners. The mounting flange 403 may have openings (not shown) which correspond to openings on the rack 404, which may be used to fasten the mounting flange 403 to the rack 404.

The sliding mechanism 402 connects the member portion 401 and the mounting flange 403. According to an exemplary embodiment, when the server/switch is in need to be removed from the rack, the mounting flange 403 can slide along the sliding mechanism 402 to move out of the way of the rack 404 and towards the server/switch chassis 405, as shown in FIG. 4B. Such a movement of the mounting flange 403, as is shown using the arrow and the dotted positioning, allows for free movement of the chassis in and out of the rack from either side of the rack 404, without any concern that the mounting flange 403 will interfere with the rack 404.

Figure 5A:
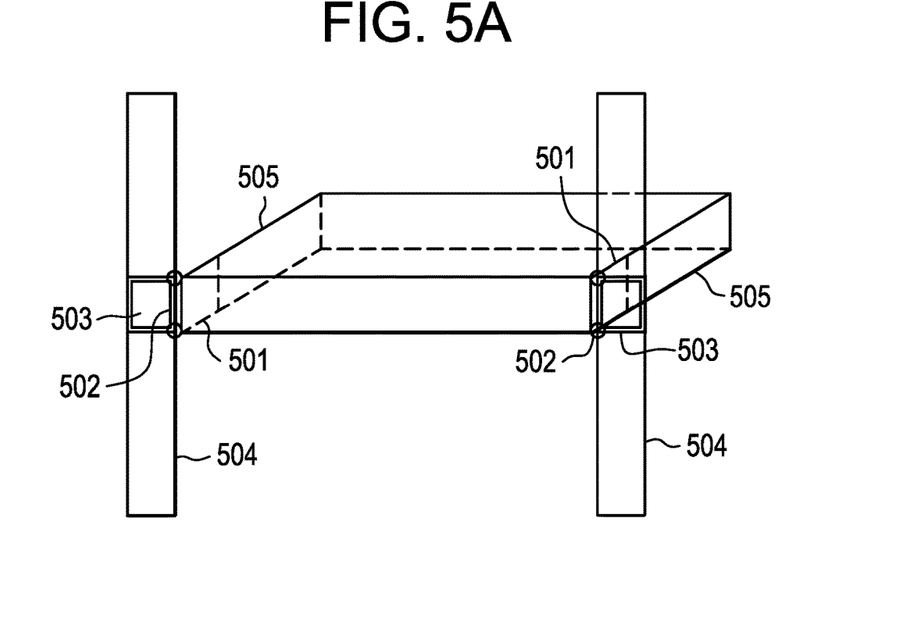
FIGS. 5A and 5B depict another exemplary embodiment of a rotatable mounting bracket.
Figure 5B:
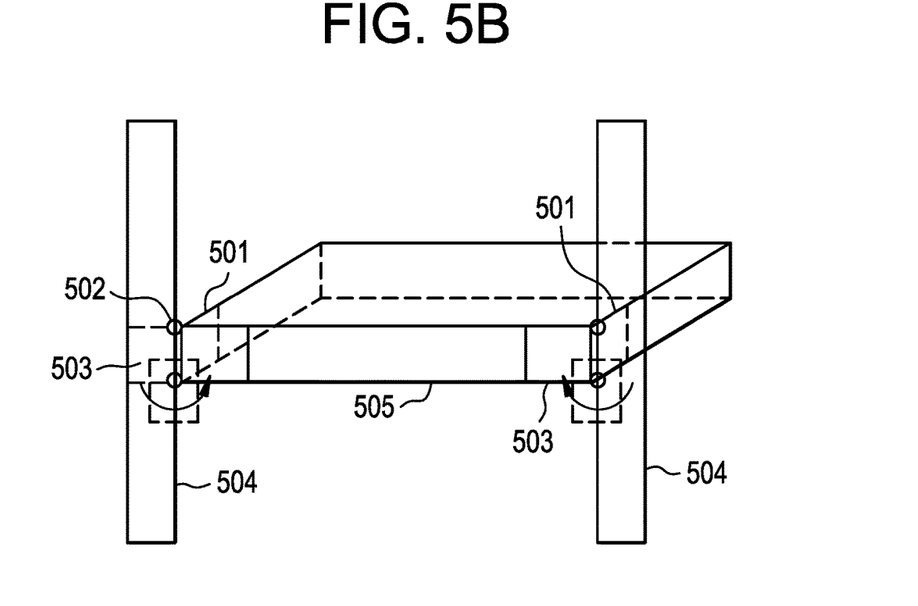

FIGS. 5A and 5B depict another exemplary embodiment of a rotatable mounting bracket, as shown from the front view of the rack.

As can be seen in FIGS. 5A and 5B, the rotatable mounting bracket depicts a member portion 501, which connects with a portion of the server/switch chassis 505 via screws, bolts or other fasteners. The member portion 501 may have openings (not shown) which correspond to openings on server/switch chassis 505, which may be used to fasten the member portion 301 to the server/switch chassis 505.

The rotatable mounting bracket further incorporates a mounting flange 503 which connects to a mounting portion of the rack 504. As can be seen in FIG. 5A, the rack 504 is depicted from the front view as being connected to the mounting flange 503. The connection between the mounting flange 503 and the mounting portion of the rack 504 may be made via screws, bolts or other fasteners. The mounting flange 503 may have openings (not shown) which correspond to openings on the rack 504, which may be used to fasten the mounting flange 503 to the rack 504.

The rotational mechanism 502 connects the member portion 501 and the mounting flange 503. According to an exemplary embodiment, when the server/switch is in need to be removed from the rack, the mounting flange 503 can rotate along the rotational mechanism 502 to move out of the way of the rack 504 and towards the server/switch chassis 505, as shown in FIG. 5B. Such a movement of the mounting flange 503, as is shown using the arrow and the dotted positioning, allows for free movement of the chassis in and out of the rack from either side of the rack 504, without any concern that the mounting flange 503 will interfere with the rack 504.

The rotatable mounting bracket may further incorporate a reinforcement mechanism which prevents the mounting flange and the member portion from flailing around when not fastened with the rack or the server/switch chassis. Such a reinforcement mechanism may be a spring loaded mechanism, according to an exemplary embodiment.

The reinforcement mechanism may further be incorporated into the pivoting mechanism, sliding mechanism or the rotational mechanism, as described above, or may be implemented as a free standing portion.

The reinforcement mechanism may further use screws, bolts or other fastening means to fasten the member portion and the mounting flange so as not to flail around when not in contact with the rack or the server/switch chassis.

Although use of screws, bolts or other fastening means is described with reference to the reinforcement mechanism, the reinforcement mechanism may be free standing as well, proving support to the member portion and the mounting flange without use of external elements.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A mounting bracket for mounting server/switch chassis to a rack, the mounting bracket comprising:
    a mounting flange;
    a member portion connected to a server/switch chassis; and a pivoting mechanism connecting the member portion and the mounting flange, wherein the mounting flange pivots along the pivoting mechanism to move from a first side of the rack to a second side of the rack,
    wherein, when the mounting flange pivots along the pivoting mechanism to the first side of the rack, the server/switch chassis is inserted in the rack in a first direction and removed out of the rack in a second direction, the first direction and the second direction being opposite with each other,
    wherein, when the mounting flange pivots along the pivoting mechanism to the second side of the rack, the server/switch chassis is inserted in the rack in the second direction and removed out of the rack in the first direction;
    wherein the pivoting mechanism further incorporates a sliding mechanism;
    wherein the pivoting of the mounting flange along the pivoting mechanism comprises sliding the mounting flange along the sliding mechanism;
    wherein the mounting flange is configured to slide along the sliding mechanism to overlap the member portion; and
    wherein the mounting flange further comprises a locking mechanism to lock the rotatable mounting bracket with the rack once the mounting bracket and the rack come in contact with each other.

2. The mounting bracket of claim 1, wherein the mounting flange is configured to pivot 360 degrees along the pivoting mechanism.

3. The mounting bracket of claim 1, wherein the mounting flange is configured to pivot 180 degrees along the pivoting mechanism.

4. The mounting bracket of claim 1, wherein the pivoting mechanism is a rotational mechanism and wherein the pivoting of the mounting flange along the pivoting mechanism comprises rotating along the rotational mechanism to overlap the member portion.

5. The mounting bracket of claim 4, wherein the mounting flange is configured to rotate 360 degrees along pivoting mechanism.

6. The mounting bracket of claim 4, wherein the mounting flange is configured to rotate 180 degrees along the pivoting mechanism.

7. The mounting bracket of claim 1, further comprising: flange; and
an unlocking plug located on the mounting flange, and
the unlocking plug unlocks the mounting bracket from the rack when the unlock plug is pressed.

8. A system for storing server/switch chassis, the system comprising:
a rack;
at least one server/switch chassis; and a rotatable mounting bracket, wherein
the rotatable mounting bracket comprises a member portion which is connected to the at least one server/switch chassis,
the rotatable mounting bracket comprises a mounting flange which further comprises a locking mechanism to lock the rotatable mounting bracket with the rack once the mounting bracket and the rack come in contact with each other,
the rotatable mounting bracket further comprises a pivoting mechanism connecting the member portion and the mounting bracket, and
wherein the mounting flange pivots along the pivoting mechanism to move from a first side of the rack to a second side of the rack;
wherein, when the mounting flange pivots along the pivoting mechanism to a first side of the rack, the server/switch chassis is inserted in the rack in a first direction and removed out of the rack in a second direction, the first direction and the second direction being opposite with each other,
wherein, when the mounting flange pivots along the pivoting mechanism to a second side of the rack, the server/switch chassis is inserted in the rack in the second direction and removed out of the rack in the first direction;
wherein the pivoting mechanism further incorporates a sliding mechanism;
wherein the pivoting of the mounting flange along the pivoting mechanism comprises sliding the mounting flange along the sliding mechanism; and
wherein the mounting flange is configured to slide along the sliding mechanism to overlap the member portion.

9. The system of claim 8, wherein the mounting flange is configured to pivot 360 degrees along the pivoting mechanism.

10. The system of claim 8, wherein the mounting flange is configured to pivot 180 degrees along the pivoting mechanism.

11. The system of claim 8, wherein the pivoting mechanism is a rotational mechanism and wherein the pivoting of the mounting flange along the pivoting mechanism comprises rotating along the rotational mechanism to overlap the member portion.

12. The system of claim 11, wherein the mounting flange is configured to rotate 360 degrees along the pivoting mechanism.

13. The system of claim 11, wherein the mounting flange is configured to rotate 180 degrees along the pivoting mechanism.

* * * * *